United States Patent
Song et al.

(10) Patent No.: US 10,892,328 B2
(45) Date of Patent: Jan. 12, 2021

(54) SOURCE/DRAIN EXTENSION REGIONS AND AIR SPACERS FOR NANOSHEET FIELD-EFFECT TRANSISTOR STRUCTURES

(71) Applicant: International Business Machines Corporation, Armonk, NY (US)

(72) Inventors: Yi Song, Albany, NY (US); Zhenxing Bi, Schenectady, NY (US); Kangguo Cheng, Schenectady, NY (US); Chi-Chun Liu, Altamont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/291,443

(22) Filed: Mar. 4, 2019

(65) Prior Publication Data

US 2020/0286992 A1    Sep. 10, 2020

(51) Int. Cl.
*H01L 29/786* (2006.01)
*H01L 29/66* (2006.01)
(Continued)

(52) U.S. Cl.
CPC ...... *H01L 29/0847* (2013.01); *H01L 21/0228* (2013.01); *H01L 21/02532* (2013.01);
(Continued)

(58) Field of Classification Search
CPC .......... H01L 29/0847; H01L 29/78696; H01L 29/66772; H01L 29/78654; H01L 21/2236;
(Continued)

(56) References Cited

U.S. PATENT DOCUMENTS 9,929,246 B1    3/2018 Cheng et al.
2015/0311286 A1*  10/2015 Lee ................... H01L 21/02532
                                                          257/351
(Continued)

OTHER PUBLICATIONS

W.M. Brewer et al., "Lateral Ge Diffusion During Oxidation of Si/SiGe Fins," Nano Letters, Mar. 1, 2017, pp. 2159-2164, vol. 17, No. 4.

*Primary Examiner* — Brian Turner
(74) *Attorney, Agent, or Firm* — Douglas Pearson; Ryan, Mason & Lewis, LLP

(57) ABSTRACT

A method of forming a semiconductor structure includes forming a nanosheet stack over a substrate, the nanosheet stack including alternating sacrificial and channel layers, the channel layers providing nanosheet channels for nanosheet field-effect transistors. The method also includes forming vertical fins in the nanosheet stack and a portion of the substrate, and forming indents in sidewalls of the sacrificial layers at sidewalls of the vertical fins. The method further includes forming nanosheet extension regions in portions of the channel layers which extend from the indented sidewalls of the sacrificial layers to the sidewalls of the vertical fins, the nanosheet extension regions increasing in thickness from the indented sidewalls of the sacrificial layers to the sidewalls of the vertical fins. The method further includes forming inner spacers using a conformal deposition process that forms air gaps in spaces between the nanosheet extension regions and the indented sidewalls of the sacrificial layers.

20 Claims, 9 Drawing Sheets

(51) Int. Cl.
    *H01L 21/02*     (2006.01)
    *H01L 21/762*     (2006.01)
    *H01L 29/423*     (2006.01)
    *H01L 29/08*     (2006.01)
    *H01L 21/8234*     (2006.01)
    *H01L 21/324*     (2006.01)
    *H01L 21/764*     (2006.01)
    *H01L 27/088*     (2006.01)
    *H01L 29/10*     (2006.01)
    *H01L 29/06*     (2006.01)

(52) U.S. Cl.
    CPC .......... *H01L 21/324* (2013.01); *H01L 21/764* (2013.01); *H01L 21/823412* (2013.01); *H01L 21/823418* (2013.01); *H01L 21/823431* (2013.01); *H01L 21/823437* (2013.01); *H01L 21/823468* (2013.01); *H01L 21/823481* (2013.01); *H01L 27/0886* (2013.01); *H01L 29/0653* (2013.01); *H01L 29/0673* (2013.01); *H01L 29/1037* (2013.01); *H01L 29/66545* (2013.01); *H01L 29/66553* (2013.01)

(58) Field of Classification Search
    CPC . H01L 29/775; H01L 29/6653; H01L 29/401; H01L 29/1037; H01L 29/6681; H01L 29/0653; H01L 29/0673; H01L 29/0665; H01L 29/7853; H01L 21/31111; H01L 29/66439; H01L 29/42392; B82Y 10/00
    See application file for complete search history.

(56) References Cited

U.S. PATENT DOCUMENTS

| | | | |
|---|---|---|---|
| 2017/0040321 A1* | 2/2017 | Mitard | H01L 29/78696 |
| 2017/0069763 A1* | 3/2017 | Doris | H01L 21/30604 |
| 2017/0256609 A1* | 9/2017 | Bhuwalka | H01L 29/66545 |
| 2017/0365604 A1* | 12/2017 | Suh | H01L 21/823807 |
| 2018/0097059 A1 | 4/2018 | Bi et al. | |
| 2018/0197965 A1 | 7/2018 | Adusumilli et al. | |
| 2018/0233398 A1 | 8/2018 | Van Cleemput et al. | |
| 2018/0374753 A1* | 12/2018 | Pawlak | H01L 21/02664 |
| 2019/0058052 A1* | 2/2019 | Frougier | H01L 29/0665 |

* cited by examiner

200

400

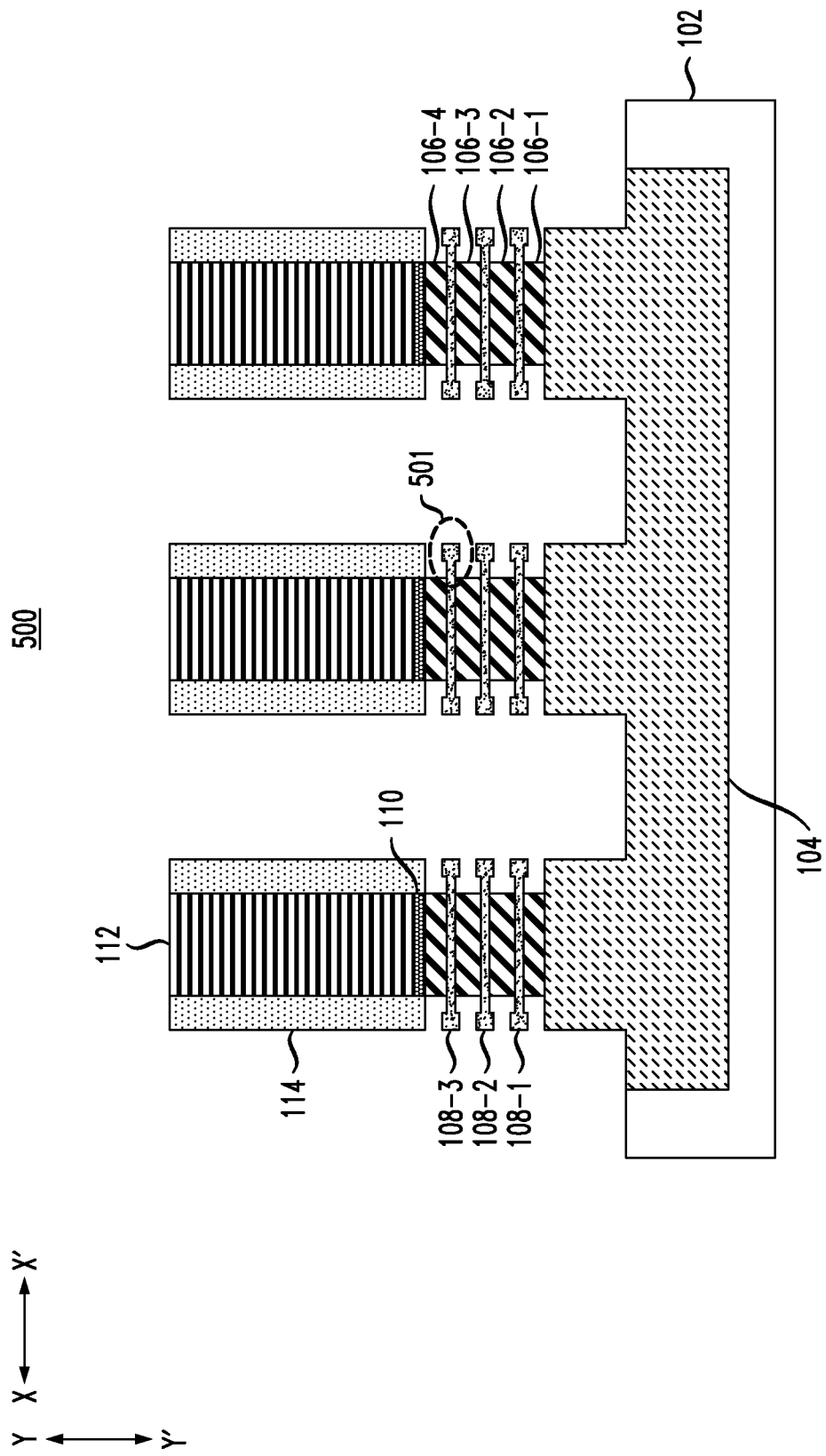

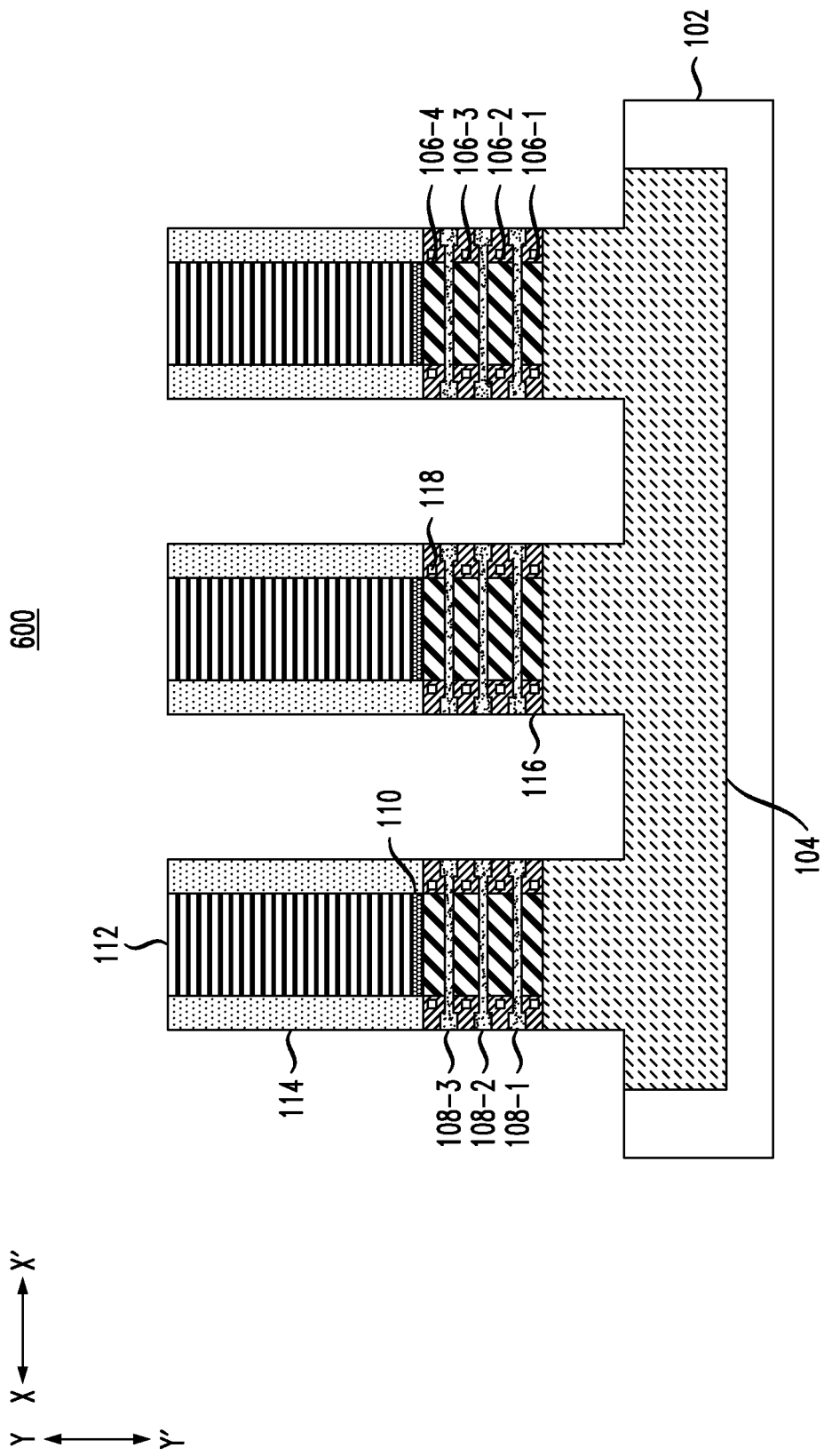

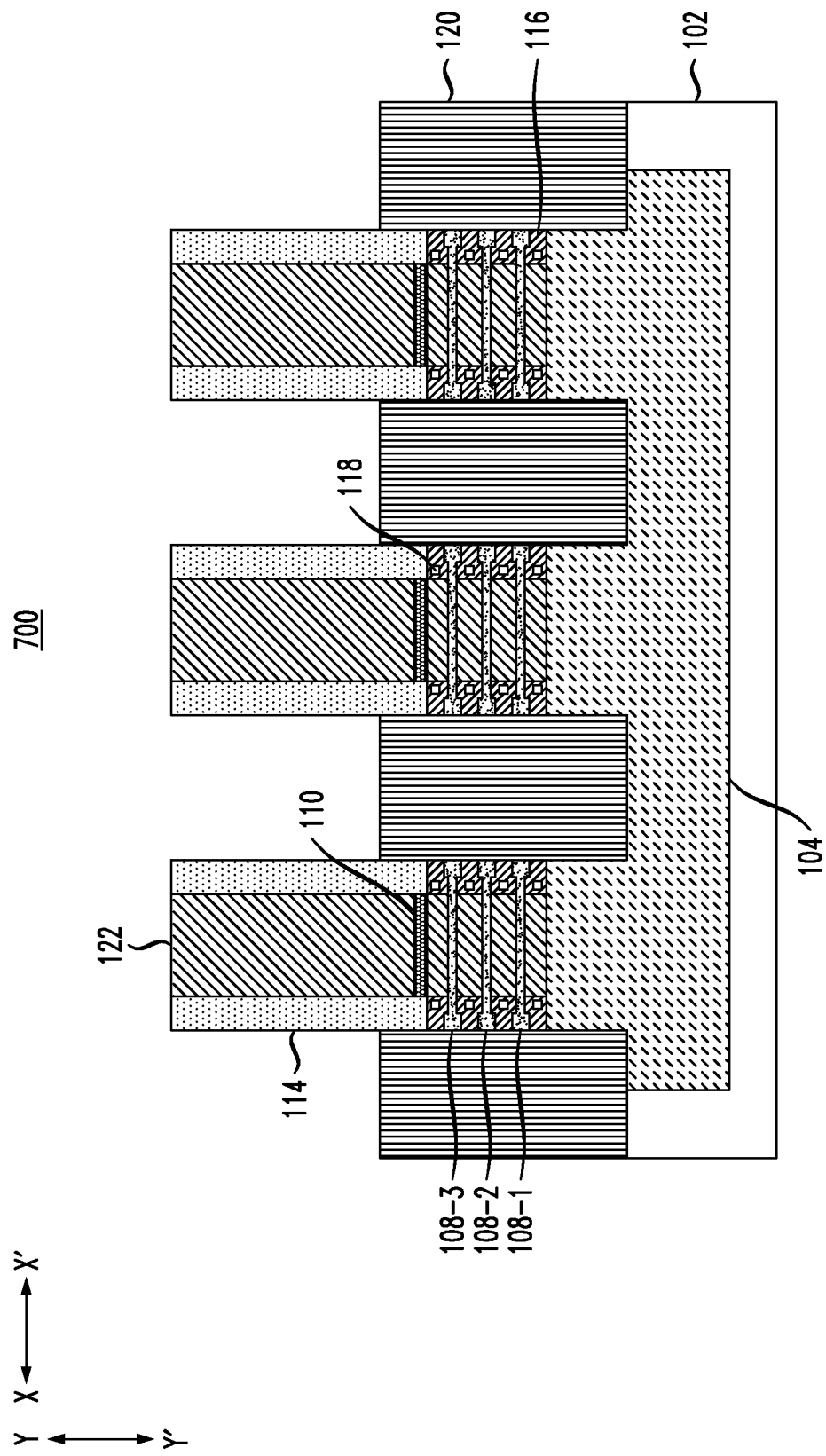

SOURCE/DRAIN EXTENSION REGIONS AND AIR SPACERS FOR NANOSHEET FIELD-EFFECT TRANSISTOR STRUCTURES

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater number of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming source/drain extension regions and air spacers for nanosheet field-effect transistor devices.

In one embodiment, a method of forming a semiconductor structure comprises forming a nanosheet stack over a substrate, the nanosheet stack comprising alternating sacrificial layers and channel layers, the channel layers providing nanosheet channels for one or more nanosheet field-effect transistors. The method also comprises forming one or more vertical fins in the nanosheet stack and at least a portion of the substrate, and forming indents in sidewalls of the sacrificial layers at vertical sidewalls of the one or more vertical fins. The method further comprises forming nanosheet extension regions in portions of the channel layers which extend from the indented sidewalls of the sacrificial layers to the vertical sidewalls of the one or more vertical fins, the nanosheet extension regions increasing in thickness from a first thickness proximate the indented sidewalls of the sacrificial layers to a second thickness proximate the vertical sidewalls of the one or more vertical fins. The method further comprises forming inner spacers using a conformal deposition process that forms air gaps in spaces between the nanosheet extension regions and the indented sidewalls of the sacrificial layers.

In another embodiment, a semiconductor structure comprises a substrate and one or more vertical fins disposed over a top surface of the substrate, the one or more vertical fins comprising a first semiconductor layer and a nanosheet channel stack disposed over the first semiconductor layer, the nanosheet channel stack comprising alternating gate stack layers and channel layers providing nanosheet channels for one or more nanosheet field-effect transistors. The gate stack layers have indented sidewalls, and the channel layers comprise nanosheet extension regions extending from the indented sidewalls of the gate stack layers to the vertical sidewalls of the one or more vertical fins, the nanosheet extension regions increasing in thickness from a first thickness proximate the indented sidewalls of the gate stack layers to a second thickness proximate the vertical sidewalls of the one or more vertical fins. The semiconductor structure also comprises inner spacers disposed in a first portion of spaces between the nanosheet extension regions, the indented sidewalls of the gate stack layers and the vertical sidewalls of the one or more vertical fins. The semiconductor structure further comprises air gaps disposed in a second portion of the spaces between the nanosheet extension regions, the indented sidewalls of the gate stack layers and the vertical sidewalls of the one or more vertical fins.

In another embodiment, an integrated circuit comprises a nanosheet field-effect transistor structure comprising a substrate and one or more vertical fins disposed over a top surface of the substrate, the one or more vertical fins comprising a first semiconductor layer and a nanosheet channel stack disposed over the first semiconductor layer, the nanosheet channel stack comprising alternating gate stack layers and channel layers providing nanosheet channels for one or more nanosheet field-effect transistors. The gate stack layers have indented sidewalls, and the channel layers comprise nanosheet extension regions extending from the indented sidewalls of the gate stack layers to the vertical sidewalls of the one or more vertical fins, the nanosheet extension regions increasing in thickness from a first thickness proximate the indented sidewalls of the gate stack layers to a second thickness proximate the vertical sidewalls of the one or more vertical fins. The nanosheet field-effect transistor structure also comprises inner spacers disposed in a first portion of spaces between the nanosheet extension regions, the indented sidewalls of the gate stack layers and the vertical sidewalls of the one or more vertical fins. The nanosheet field-effect transistor structure further comprises air gaps disposed in a second portion of the spaces between the nanosheet extension regions, the indented sidewalls of the gate stack layers and the vertical sidewalls of the one or more vertical fins.

BRIEF DESCRIPTION OF THE DRAWINGS

FIG. 5A depicts a cross-sectional view of the FIG. 4A structure following formation of additional indents in the sacrificial layers of the nanosheet stack, according to an embodiment of the invention.

FIG. 6 depicts a cross-sectional view of the FIG. 5A structure following formation of air gaps and inner spacers, according to an embodiment of the invention.

FIG. 7 depicts a cross-sectional view of the FIG. 6 structure following a replacement metal gate process and formation of source/drain regions, according to an embodiment of the invention.

DETAILED DESCRIPTION

Figure 1:
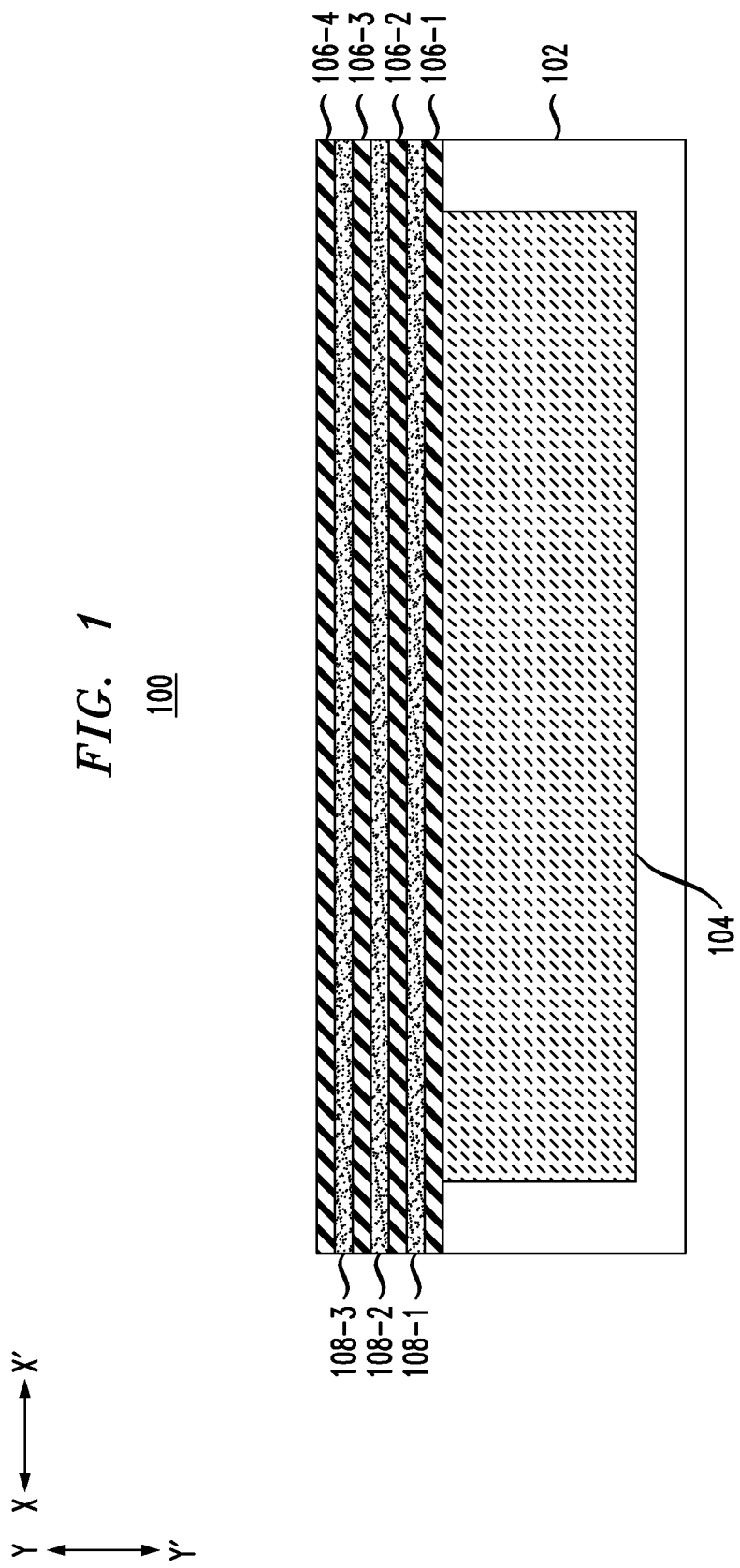
FIG. 1 depicts a cross-sectional view of a semiconductor structure including a nanosheet stack formed over a substrate, according to an embodiment of the invention.

Illustrative embodiments of the invention may be described herein in the context of illustrative methods for forming source/drain extension regions and air spacers for nanosheet field-effect transistor devices, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing the applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

In some embodiments, techniques for reducing the size of FETs include the use of stacked nanosheet channels formed over a semiconductor substrate. Stacked nanosheets may be two-dimensional nanostructures, such as sheets having a thickness range on the order of 1 to 100 nanometers (nm). Nanosheets and nanowires are viable options for scaling to 7 nm and beyond. A general process flow for formation of a nanosheet stack involves removing sacrificial layers, which may be formed of silicon germanium (SiGe), between sheets of channel material, which may be formed of silicon (Si).

The extension profile of stacked nanosheet channels can affect the parasitic capacitance of the resulting nanosheet FET devices. Illustrative embodiments provide techniques for optimizing the nanosheet extension profile, reducing the parasitic capacitance. Some embodiments also provide for a large extension surface, which provides further improvements as the starting source/drain epitaxial surface. Air gaps (also referred to herein as air spacers or air gap spacers) may be formed between the gate region of nanosheet FET devices and the source/drain regions, which provide further reduction in parasitic capacitance. Some embodiments utilize techniques that provide a gradual change in the source/drain extension width underneath the inner spacers and the air gap spacers.

Illustrative processes for forming gradual-curved source/drain extensions and air gap spacers for nanosheet FET devices will now be described with respect to FIGS. 1-7.

FIG. 1 shows a cross-sectional view 100 of a semiconductor layer stack, including a substrate 102, an n-well 104 formed in the substrate 102, and a nanosheet stack including alternating layers of a sacrificial material and a channel material. In FIG. 1, the nanosheet stack includes a set of sacrificial layers 106-1, 106-2, 106-3 and 106-4 (collectively, sacrificial layers 106) and a set of channel layers 108-1, 108-2 and 108-3 (collectively, channel layers 108).

The substrate 102 and channel layers 108 may be formed of any suitable semiconductor material, including various silicon-containing materials such as Si, SiGe, silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

The n-well 104 may be formed by introducing dopants into the substrate 102, which is assumed to be a p-type substrate, prior to forming the nanosheet stack. The n-well 104 may be formed using ion implantation, a diffusion process, etc. Although FIG. 1 shows an n-well 104 formed in what is assumed to be a p-type substrate 102, in other embodiments a p-well may be formed in an n-type substrate, the n-well or p-well may be formed in only a portion of the substrate, etc., as desired based on the type of nanosheet FET devices that are to be formed.

The sacrificial layers 106 are formed from a material that may be removed selective to the material of the substrate 102 and channel layers 108. In the description below, it is assumed that the substrate 102 and channel layers 108 are formed of Si, while the sacrificial layers 106 are formed of SiGe. In some embodiments, the sacrificial layers 106 may be formed of $Si_{0.75}Ge_{0.25}$.

The horizontal thickness or width (in direction X-X') of the FIG. 1 structure may vary, such as based on the number of vertical fins of nanosheet stacks that are to be formed therefrom as described in further detail below. The vertical thickness or height (in direction Y-Y') of the substrate 102 may vary as desired, and may be in the range of thousands of micrometers. The vertical thickness or height (in direction Y-Y') of the n-well 104 in the substrate 102 may be in the range of 10 to 500 nm.

For the nanosheet stack, the channel layers 108 are formed relatively thicker than the sacrificial layers 106. For example, each of the channel layers 108 may have a height or vertical thickness (in direction Y-Y') of 11 nm or more generally in the range of 3 to 20 nm while each of the sacrificial layers 106 may have a height or vertical thickness (in direction Y-Y') of 6 nm or more generally in the range of 3 to 30 nm. This is in contrast with conventional techniques, whereby channel layers and sacrificial layers may be formed with a same or very similar thickness (e.g., with sacrificial layers of 8 nm thickness and channel layers of 9 nm thickness).

Figure 2:
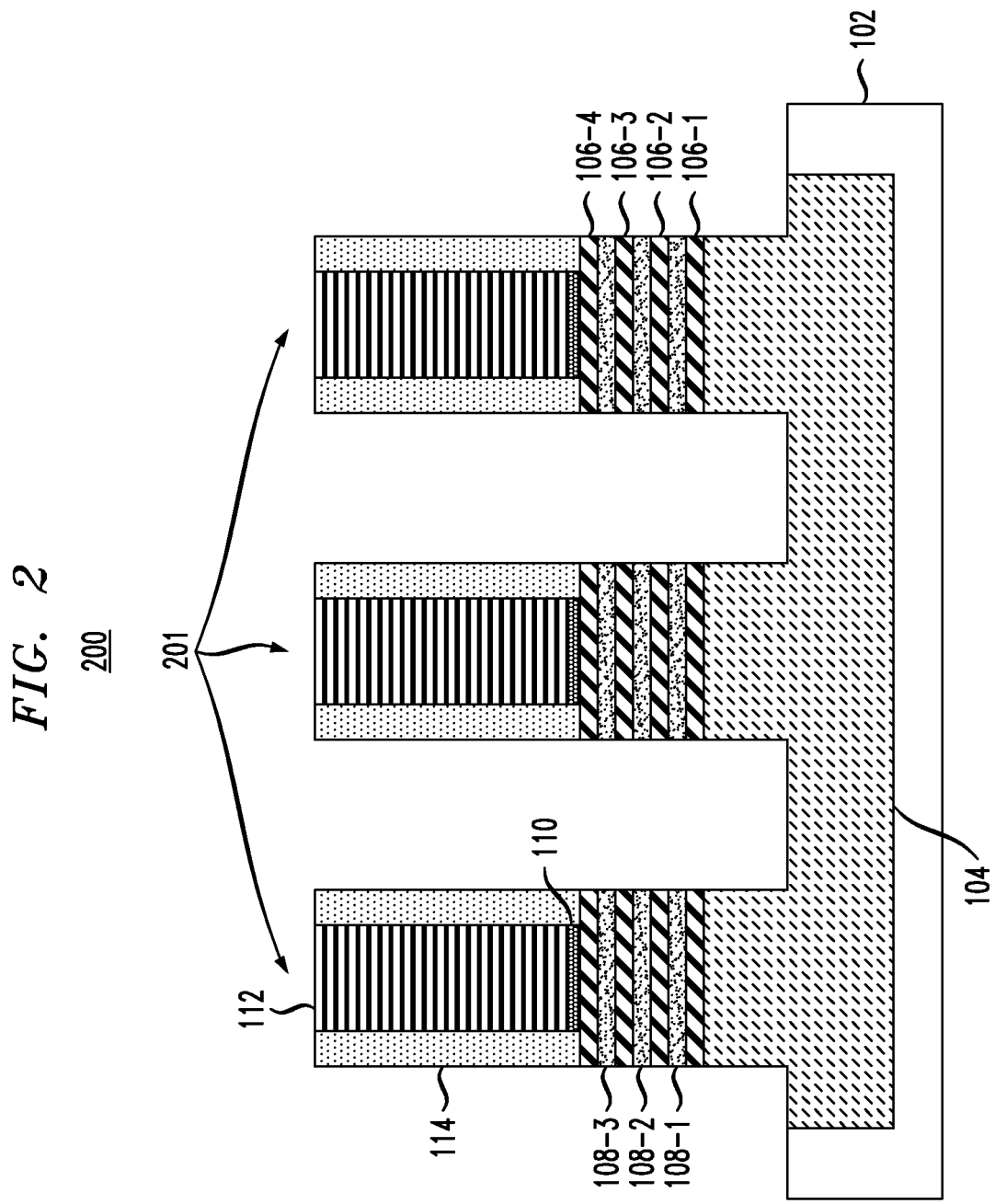
FIG. 2 depicts a cross-sectional view of the FIG. 1 structure following formation of vertical fins, according to an embodiment of the invention.

FIG. 2 shows a cross-sectional view 200 of the FIG. 1 structure, following formation of vertical fins 201 from the semiconductor stack. The cross-sectional view 200 of FIG. 2 (as well as the cross-sectional view of FIGS. 3-7), are taken across or perpendicular to the length of the vertical fins 201. The vertical fins 201 may be formed using sidewall image transfer (SIT) or other suitable techniques such as lithography and etching including reactive-ion etching (ME), etc. Although FIG. 2 shows an example where three vertical fins 201 are formed, it should be appreciated that more or fewer than three vertical fins may be formed as desired for a particular application. Each of the vertical fins 201 may have a width or horizontal thickness (in direction X-X') in the range of 4 to 200 nm. As illustrated in FIG. 2, the fin patterning etches portions of the nanosheet stack and the underlying n-well 104 and substrate 102, such that each of the vertical fins 201 has a height or vertical thickness (in direction Y-Y') in the range of 10 to 300 nm.

FIG. 2 also illustrates the gate patterning of an isolation layer 110 and a dummy gate 112. Sidewall spacers 114 are then formed along the patterned isolation layer 110 and dummy gate 112. The vertical fins 201 are recessed (e.g., extended into the substrate 102 at the source/drain region) after formation of the sidewall spacers 114.

The isolation layer 110 may be formed of silicon dioxide ($SiO_2$) or another suitable material such as silicon nitride (SiN), silicon carbon (SiC), etc. The isolation layer 110 may have a height or vertical thickness (in direction Y-Y') ranging from 1 to 20 nm. The width or horizontal thickness (in direction X-X') of the isolation layer 110 may be in the range of 4 to 200 nm.

The dummy gate 112 may be formed of amorphous silicon (a-Si), amorphous silicon germanium (a-SiGe), $SiO_2$, titanium nitride (TiN) or another suitable material. The dummy gate 112 has a width or horizontal thickness (in direction X-X') that matches that of the underlying isolation layer 110. The dummy gate 112 may have a height or vertical thickness (in direction Y-Y') ranging from 10 to 500 nm.

The sidewalls spacers 114 may be formed of SiN, silicon boron carbide nitride (SiBCN), silicon oxycarbide (SiOC), silicon carbon nitride (SiCN) or another suitable material. The sidewall spacers 114 may have a height or vertical thickness (in direction Y-Y') that matches the combined height of the isolation layer 110 and dummy gate 112 as illustrated. The sidewalls spacers 114 may have a width or horizontal thickness (in direction X-X') sufficient to cover a remaining portion of the top surfaces of the nanosheet stack of each of the vertical fins 201 not covered by the isolation layer 110 as illustrated.

Figure 3:
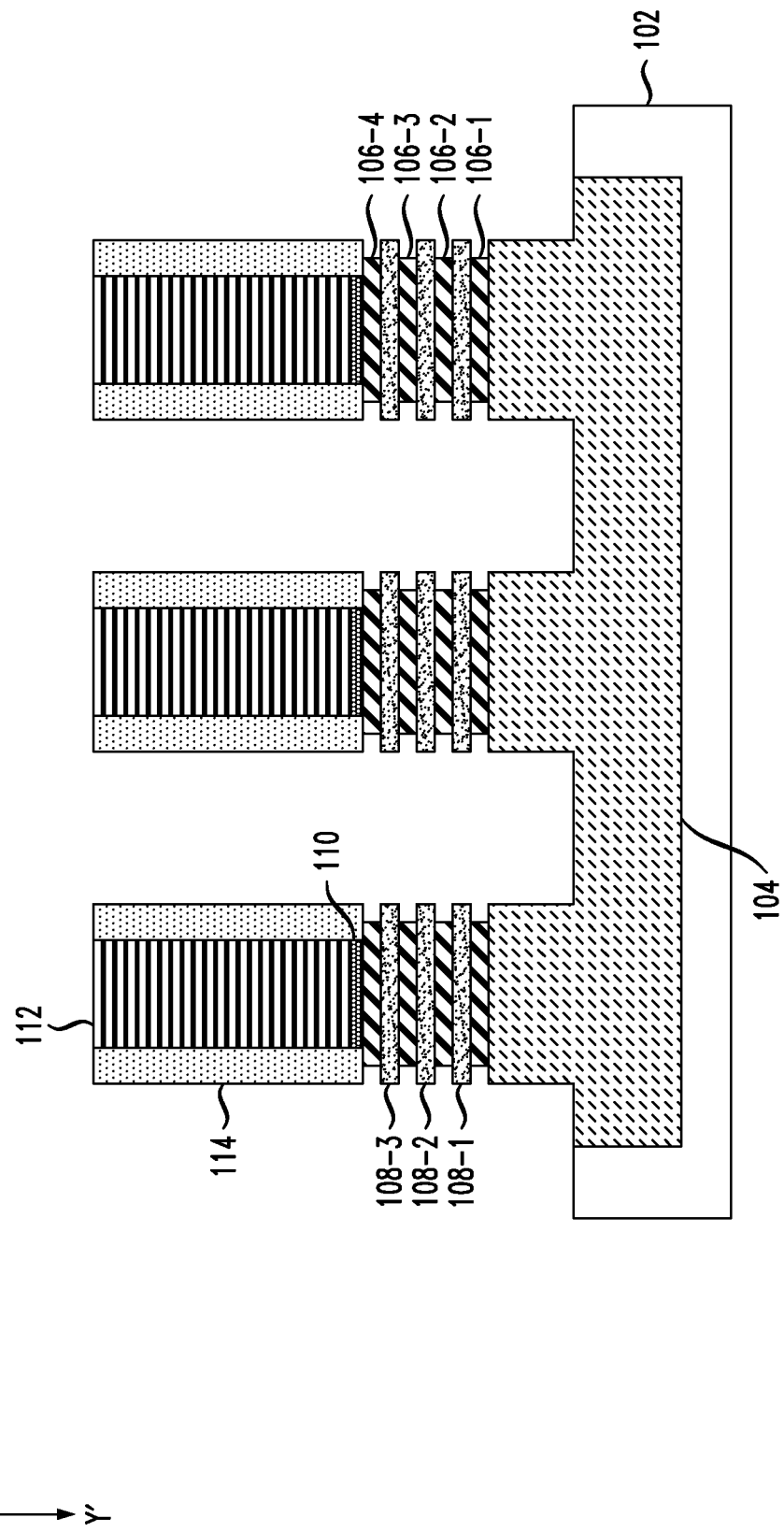
FIG. 3 depicts a cross-sectional view of the FIG. 2 structure following formation of indents in sacrificial layers of the nanosheet stack, according to an embodiment of the invention.

FIG. 3 shows a cross-sectional view 300 of the FIG. 2 structure following indentation of the sacrificial layers 106 of the nanosheet stack. The indentation of the sacrificial layers 106 may be formed by using an etching that removes the material of the sacrificial layers 106 (e.g., SiGe) selective to that of the channel layers 108, n-well 104 and substrate 102 (e.g., Si). The indentation of the sacrificial layers 106 may be to a depth of 2 nm, or more generally a depth in the range of 1 to 10 nm.

Figure 4A:
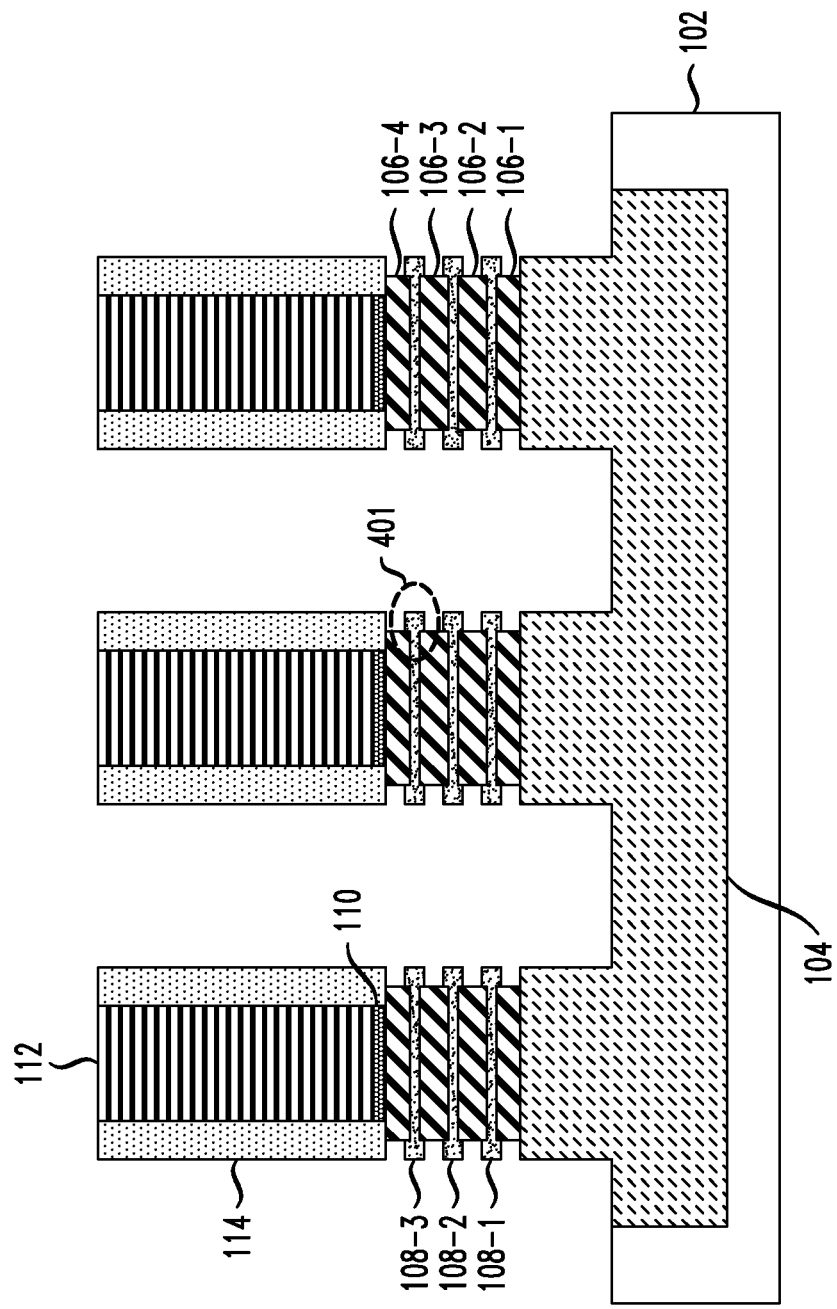
FIG. 4A depicts a cross-sectional view of the FIG. 3 structure following a thermal anneal to form gradually curved source/drain extension regions in channel layers of the nanosheet stack, according to an embodiment of the invention.
Figure 4B:
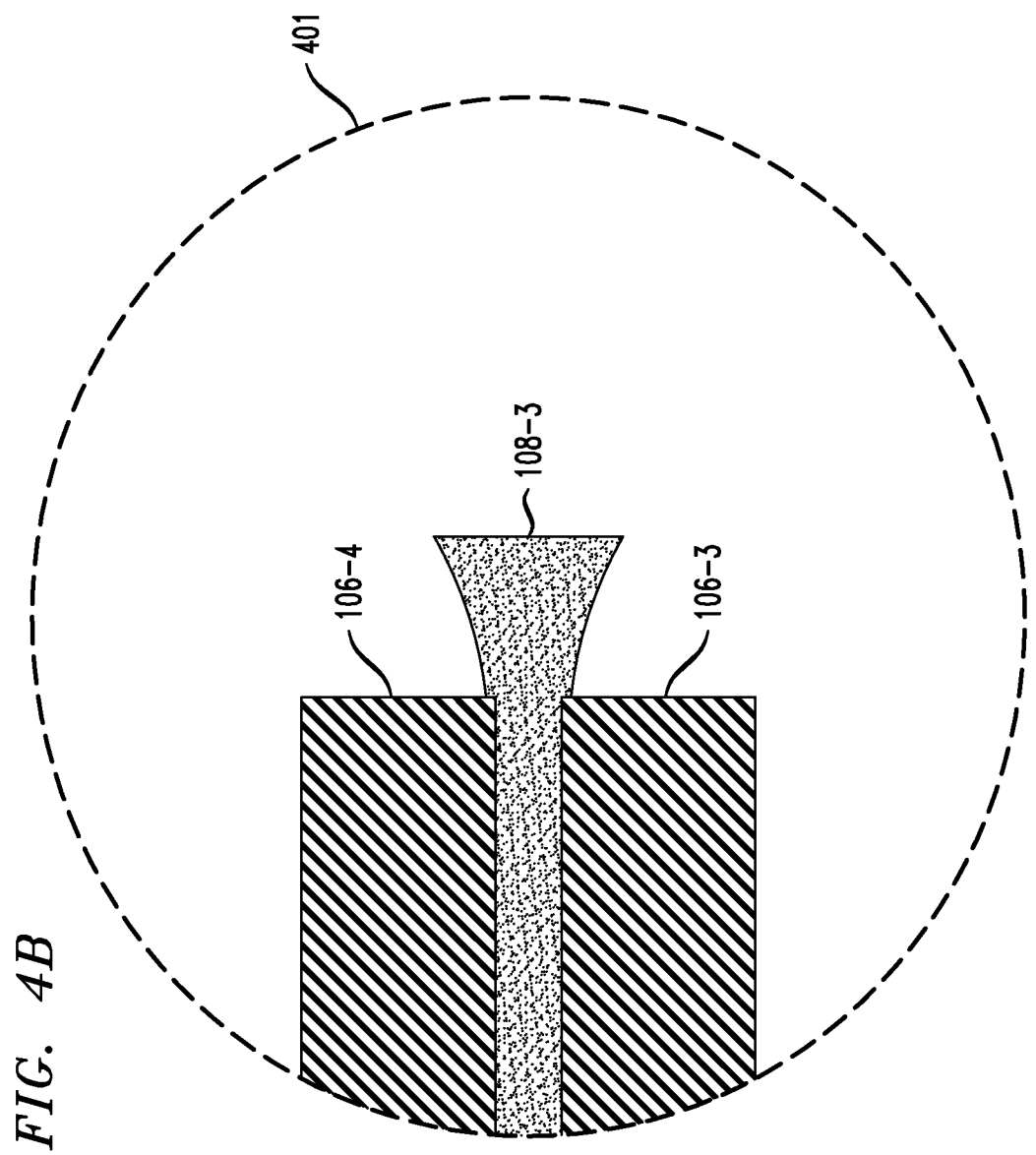
FIG. 4B depicts a close-up view of the gradually curved source/drain extension region for one of the channel layers of the nanosheet stack in the FIG. 4A structure, according to an embodiment of the invention.

FIG. 4A shows a cross-sectional view of 400 of the FIG. 3 structure following a thermal anneal that drives-in material from the sacrificial layers 106 to the channel layers 108. For example, the thermal anneal may be a rapid thermal processing (RTP) anneal at a temperature in the range of 800 to 900 degrees Celsius (° C.) for a duration of approximately ten minutes, which drives in germanium (Ge) from the SiGe sacrificial layers 106 to the Si channel layers 108. The boundary curve results in a gradual change in the thickness of the channel layers 108 due to the Ge out-diffusion. This gradual change is illustrated in FIG. 4B, which shows a close-up view of section 401 of an edge of one of the channel layers 108-3 between sacrificial layers 106-3 and 106-4. As illustrated in FIG. 4B, the channel layer 108-3 undergoes a gradual curved change in thickness as a result of the anneal processing.

FIG. 5A shows a cross-sectional view 500 of the FIG. 4A structure following an additional indentation of the sacrificial layers 106 of the nanosheet stack. The additional indentation may utilize selective SiGe over Si etching processing, and may be to a depth of 2 nm or more generally a depth in the range of 1 to 10 nm. The additional indentation shown in FIG. 5A, in some embodiments, occurs after the channel layers 108 include some Ge content due to the out-diffusion from the SiGe sacrificial layers 106 in the thermal anneal step described above. Thus, the selective SiGe over Si etching may utilize an etchant that is selective only to the sacrificial layers 106 that have a higher Ge % than the channel layers 108.

Figure 5B:
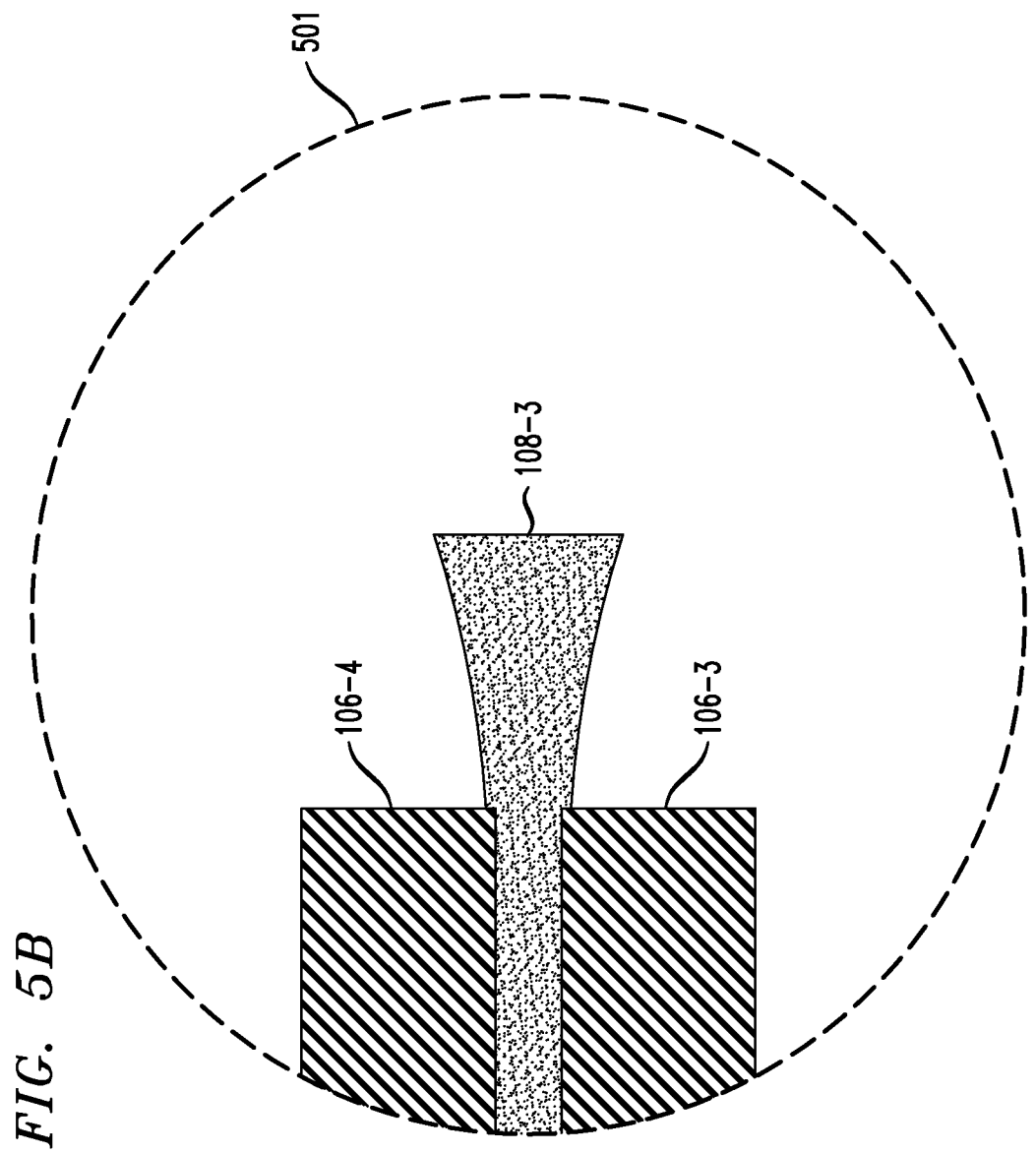
FIG. 5B depicts a close-up view of the gradually curved source drain extension region for one of the channel layers of the nanosheet stack in the FIG. 5A structure following formation of the additional indents, according to an embodiment of the invention.

The additional indentation defines a shape for inner spacers that will be formed as described in further detail below. FIG. 5B shows a close-up view of section 501 which illustrates the further indentation of the sacrificial layers 106-3 and 106-4 relative to the channel layer 108-3. As shown in the close-up view 501, the space closer to the edges of the sacrificial layers 106 is greater than that proximate the edges of the channel layers 108. This facilitates formation of air gap spacers as described in further detail below.

FIG. 6 shows a cross-sectional view 600 of the FIG. 5A structure following deposition and etch-back of an inner spacer 116. The inner spacer 116 may be deposited using atomic layer deposition (ALD), such that the material of the inner spacer 116 pinches off due to the narrower opening at the edges of the channel layers 108 resulting in air gap spacers 118.

FIG. 7 shows a cross-sectional view 700 of the FIG. 6 structure following formation of source/drain regions 120 and following replacement of the dummy gate 112 and sacrificial layers 106 with gate 122. The gate 122 may include a gate stack of a gate dielectric followed by a gate conductor.

The gate dielectric may be formed of a high-k dielectric material. Examples of high-k materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric may have a uniform thickness in the range of 1 nm to 3 nm.

The gate conductor may include a metal gate or work function metal (WFM). For nFET devices, the WFM for the gate conductor may be titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the WFM for the gate conductor may be TiN, TaN, or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for the gate conductor as desired.

The source/drain regions 120 may be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants or p-type dopants, depending on the type of transistor. The dopant concentration can range from $1\times10^{19}$ cm$^{-3}$ to $3\times10^{21}$ cm$^{-3}$, or preferably between $2\times10^{20}$ cm$^{-3}$ to $3\times10^{21}$ cm$^{-3}$. The implantation of suitable dopants may be performed using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride (BF$_2$), gallium (Ga), indium (In), and thallium (Tl).

In some embodiments, a method of forming a semiconductor structure comprises forming a nanosheet stack over a substrate, the nanosheet stack comprising alternating sacrificial layers and channel layers, the channel layers providing nanosheet channels for one or more nanosheet FETs. The method also comprises forming one or more vertical fins in the nanosheet stack and at least a portion of the substrate, and forming indents in sidewalls of the sacrificial layers at vertical sidewalls of the one or more vertical fins. The method further comprises forming nanosheet extension regions in portions of the channel layers which extend from the indented sidewalls of the sacrificial layers to the vertical sidewalls of the one or more vertical fins, the nanosheet extension regions increasing in thickness from a first thickness proximate the indented sidewalls of the sacrificial layers to a second thickness proximate the vertical sidewalls of the one or more vertical fins. The method further comprises forming inner spacers using a conformal deposition process that forms air gaps in spaces between the nanosheet extension regions and the indented sidewalls of the sacrificial layers.

Forming the nanosheet stack may comprise forming the channel layers with a first thickness and forming the sacrificial layers with a second thickness less than the first thickness. The channel layers may comprise Si and the sacrificial layers may comprise SiGe. Forming the nanosheet extension regions may comprise performing a thermal anneal that drives in Ge from the sacrificial layers to the channel layers. The thermal anneal may produce a boundary curve that gradually changes as distance from the indented sidewalls of the sacrificial layers towards the vertical sidewalls of the channel layers increases. Performing the thermal anneal comprises rapid thermal processing at a temperature in the range of about 800° C. to about 900° C. for a duration of approximately ten minutes.

Forming the inner spacers may comprise depositing spacer material utilizing ALD to pinch off the spaces between the nanosheet extension regions and the indented sidewalls of the sacrificial layers leaving at least a portion of space defined by the indented sidewalls as the air gaps.

The method may further comprise, prior to formation of the indented sidewalls of the sacrificial layers, forming an isolation layer over at least a portion of a top surface of nanosheet stacks, forming a dummy gate over a top surface of the isolation layer, and forming sidewall spacers over a remaining portion of the top surface of the nanosheet stacks surrounding the isolation layer and the dummy gate. The method may further comprise, subsequent to formation of the inner spacers and air gaps, performing an RMG process to replace the dummy gate and remaining portions of the sacrificial layers with a gate stack. The method may further comprise forming source/drain regions over portions of a top surface of the substrate surrounding the sidewalls of the one or more vertical fins and the nanosheet stack. The outer edges of the nanosheet extension regions may provide a starting surface for epitaxial growth of the source/drain regions.

Forming the indents in the sidewalls of the sacrificial layers may comprise forming first indents in the sidewalls of the sacrificial layers prior to forming the nanosheet extension regions, and forming second indents in the sidewalls of the sacrificial layers subsequent to forming the nanosheet extension regions, wherein the air gaps are formed in at least a portion of the space defined by the second indents.

In some embodiments, a semiconductor structure comprises a substrate and one or more vertical fins disposed over a top surface of the substrate, the one or more vertical fins comprising a first semiconductor layer and a nanosheet channel stack disposed over the first semiconductor layer, the nanosheet channel stack comprising alternating gate stack layers and channel layers providing nanosheet channels for one or more nanosheet FETs. The gate stack layers have indented sidewalls, and the channel layers comprise nanosheet extension regions extending from the indented sidewalls of the gate stack layers to the vertical sidewalls of the one or more vertical fins, the nanosheet extension regions increasing in thickness from a first thickness proximate the indented sidewalls of the gate stack layers to a second thickness proximate the vertical sidewalls of the one or more vertical fins. The semiconductor structure also comprises inner spacers disposed in a first portion of spaces between the nanosheet extension regions, the indented sidewalls of the gate stack layers and the vertical sidewalls of the one or more vertical fins. The semiconductor structure further comprises air gaps disposed in a second portion of the spaces between the nanosheet extension regions, the indented sidewalls of the gate stack layers and the vertical sidewalls of the one or more vertical fins.

The semiconductor structure may further comprise an isolation layer disposed over at least a portion of a top surface of the nanosheet stack, a gate stack disposed over a top surface of the isolation layer, and sidewall spacers disposed over a remaining portion of the top surface of the nanosheet stack surrounding the isolation layer and the gate stack.

The semiconductor structure may further comprise source/drain regions disposed over portions of the top surface of the substrate surrounding the sidewalls of the one or more vertical fins. The nanosheet extension regions may have a curved thickness profile that increases from the first thickness to the second thickness from the indented sidewalls of the gate stack layers to the source/drain regions.

In some embodiments, an integrated circuit comprises a nanosheet FET structure comprising a substrate and one or more vertical fins disposed over a top surface of the substrate, the one or more vertical fins comprising a first semiconductor layer and a nanosheet channel stack disposed over the first semiconductor layer, the nanosheet channel stack comprising alternating gate stack layers and channel layers providing nanosheet channels for one or more nanosheet FETs. The gate stack layers have indented sidewalls, and the channel layers comprise nanosheet extension regions extending from the indented sidewalls of the gate stack layers to the vertical sidewalls of the one or more vertical fins, the nanosheet extension regions increasing in thickness from a first thickness proximate the indented sidewalls of the gate stack layers to a second thickness proximate the vertical sidewalls of the one or more vertical fins. The nanosheet FET structure also comprises inner spacers disposed in a first portion of spaces between the nanosheet extension regions, the indented sidewalls of the gate stack layers and the vertical sidewalls of the one or more vertical fins. The nanosheet FET structure further comprises air gaps disposed in a second portion of the spaces between the nanosheet extension regions, the indented sidewalls of the gate stack layers and the vertical sidewalls of the one or more vertical fins.

The nanosheet FET structure may further comprise an isolation layer disposed over at least a portion of a top surface of the nanosheet stack, a gate stack disposed over a top surface of the isolation layer, and sidewall spacers disposed over a remaining portion of the top surface of the nanosheet stack surrounding the isolation layer and the gate stack.

The nanosheet FET structure may further comprise source/drain regions disposed over portions of the top surface of the substrate surrounding the sidewalls of the one or more vertical fins. The nanosheet extension regions may have a curved thickness profile that increases from the first thickness to the second thickness from the indented sidewalls of the gate stack layers to the source/drain regions.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors and sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming a nanosheet stack over a substrate, the nanosheet stack comprising alternating sacrificial layers and channel layers, the channel layers providing nanosheet channels for one or more nanosheet field-effect transistors;
    forming one or more vertical fins in the nanosheet stack and at least a portion of the substrate;
    forming indents in sidewalls of the sacrificial layers at vertical sidewalls of the one or more vertical fins;
    forming nanosheet extension regions in portions of the channel layers which extend from the indented sidewalls of the sacrificial layers to the vertical sidewalls of the one or more vertical fins, the nanosheet extension regions increasing in thickness from a first thickness proximate the indented sidewalls of the sacrificial layers to a second thickness proximate the vertical sidewalls of the one or more vertical fins; and
    forming inner spacers using a conformal deposition process that forms air gaps in spaces between the nanosheet extension regions and the indented sidewalls of the sacrificial layers;
    wherein the nanosheet extension regions have a curved thickness profile that gradually increases from the first thickness proximate the indented sidewalls of the sacrificial layers to the second thickness proximate the vertical sidewalls of the one or more vertical fins.

2. The method of claim 1, wherein forming the nanosheet stack comprises forming the channel layers with a first thickness and forming the sacrificial layers with a second thickness less than the first thickness.

3. The method of claim 2, wherein the channel layers comprise silicon and the sacrificial layers comprise silicon germanium.

4. The method of claim 1, wherein forming the inner spacers comprises depositing spacer material utilizing atomic layer deposition to pinch off the spaces between the nanosheet extension regions and the indented sidewalls of the sacrificial layers leaving at least a portion of space defined by the indented sidewalls as the air gaps.

5. The method of claim 1, further comprising, prior to formation of the indented sidewalls of the sacrificial layers:
    forming an isolation layer over at least a portion of a top surface of nanosheet stacks;
    forming a dummy gate over a top surface of the isolation layer; and
    forming sidewall spacers over a remaining portion of the top surface of the nanosheet stacks surrounding the isolation layer and the dummy gate.

6. The method of claim 5, further comprising, subsequent to formation of the inner spacers and air gaps, performing a replacement metal gate process to replace the dummy gate and remaining portions of the sacrificial layers with a gate stack.

7. The method of claim 6, further comprising forming source/drain regions over portions of a top surface of the substrate surrounding the sidewalls of the one or more vertical fins and the nanosheet stack.

8. The method of claim 7, wherein outer edges of the nanosheet extension regions provide a starting surface for epitaxial growth of the source/drain regions.

9. The method of claim 1, wherein forming the indents in the sidewalls of the sacrificial layers comprises:
   forming first indents in the sidewalls of the sacrificial layers prior to forming the nanosheet extension regions; and
   forming second indents in the sidewalls of the sacrificial layers subsequent to forming the nanosheet extension regions;
   wherein the air gaps are formed in at least a portion of the space defined by the second indents.

10. A method of forming a semiconductor structure, comprising:
    forming a nanosheet stack over a substrate, the nanosheet stack comprising alternating sacrificial layers and channel layers, the channel layers providing nanosheet channels for one or more nanosheet field-effect transistors;
    forming one or more vertical fins in the nanosheet stack and at least a portion of the substrate;
    forming indents in sidewalls of the sacrificial layers at vertical sidewalls of the one or more vertical fins;
    forming nanosheet extension regions in portions of the channel layers which extend from the indented sidewalls of the sacrificial layers to the vertical sidewalls of the one or more vertical fins, the nanosheet extension regions increasing in thickness from a first thickness proximate the indented sidewalls of the sacrificial layers to a second thickness proximate the vertical sidewalls of the one or more vertical fins; and
    forming inner spacers using a conformal deposition process that forms air gaps in spaces between the nanosheet extension regions and the indented sidewalls of the sacrificial layers;
    wherein forming the nanosheet stack comprises forming the channel layers with a first thickness and forming the sacrificial layers with a second thickness less than the first thickness;
    wherein the channel layers comprise silicon and the sacrificial layers comprise silicon germanium; and
    wherein forming the nanosheet extension regions comprises performing a thermal anneal that drives in germanium from the sacrificial layers to the channel layers.

11. The method of claim 10, wherein the thermal anneal produces a boundary curve that gradually changes as distance from the indented sidewalls of the sacrificial layers towards the vertical sidewalls of the channel layers increases.

12. The method of claim 10, wherein performing the thermal anneal comprises rapid thermal processing at a temperature in the range of about 800 degrees Celsius to about 900 degrees Celsius for a duration of approximately ten minutes.

13. A semiconductor structure, comprising:
    a substrate;
    one or more vertical fins disposed over a top surface of the substrate, the one or more vertical fins comprising a first semiconductor layer and a nanosheet channel stack disposed over the first semiconductor layer, the nanosheet channel stack comprising alternating gate stack layers and channel layers providing nanosheet channels for one or more nanosheet field-effect transistors;
    the gate stack layers having indented sidewalls;
    the channel layers comprising nanosheet extension regions extending from the indented sidewalls of the gate stack layers to the vertical sidewalls of the one or more vertical fins, the nanosheet extension regions increasing in thickness from a first thickness proximate the indented sidewalls of the gate stack layers to a second thickness proximate the vertical sidewalls of the one or more vertical fins;
    inner spacers disposed in a first portion of spaces between the nanosheet extension regions, the indented sidewalls of the gate stack layers and the vertical sidewalls of the one or more vertical fins; and
    air gaps disposed in a second portion of the spaces between the nanosheet extension regions, the indented sidewalls of the gate stack layers and the vertical sidewalls of the one or more vertical fins;
    wherein the nanosheet extension regions have a curved thickness profile that gradually increases from the first thickness proximate the indented sidewalls of the sacrificial layers to the second thickness proximate the vertical sidewalls of the one or more vertical fins.

14. The semiconductor structure of claim 13, further comprising:
    an isolation layer disposed over at least a portion of a top surface of the nanosheet stack;
    a gate stack disposed over a top surface of the isolation layer; and
    sidewall spacers disposed over a remaining portion of the top surface of the nanosheet stack surrounding the isolation layer and the gate stack.

15. The semiconductor structure of claim 13, further comprising source/drain regions disposed over portions of the top surface of the substrate surrounding the sidewalls of the one or more vertical fins.

16. The semiconductor structure of claim 15, wherein the curved thickness profile of the nanosheet extension regions gradually increases from the first thickness to the second thickness from the indented sidewalls of the gate stack layers to the source/drain regions.

17. An integrated circuit comprising:
    a nanosheet field-effect transistor structure comprising:
    a substrate;
    one or more vertical fins disposed over a top surface of the substrate, the one or more vertical fins comprising a first semiconductor layer and a nanosheet channel stack disposed over the first semiconductor layer, the nanosheet channel stack comprising alternating gate stack layers and channel layers providing nanosheet channels for one or more nanosheet field-effect transistors;
    the gate stack layers having indented sidewalls;
    the channel layers comprising nanosheet extension regions extending from the indented sidewalls of the gate stack layers to the vertical sidewalls of the one or more vertical fins, the nanosheet extension regions increasing in thickness from a first thickness proximate the indented sidewalls of the gate stack layers to a second thickness proximate the vertical sidewalls of the one or more vertical fins;

inner spacers disposed in a first portion of spaces between the nanosheet extension regions, the indented sidewalls of the gate stack layers and the vertical sidewalls of the one or more vertical fins; and air gaps disposed in a second portion of the spaces between the nanosheet extension regions, the indented sidewalls of the gate stack layers and the vertical sidewalls of the one or more vertical fins;

wherein the nanosheet extension regions have a curved thickness profile that gradually increases from the first thickness proximate the indented sidewalls of the sacrificial layers to the second thickness proximate the vertical sidewalls of the one or more vertical fins.

18. The integrated circuit of claim 17, wherein the nanosheet field-effect transistor structure further comprises:

an isolation layer disposed over at least a portion of a top surface of the nanosheet stack;

a gate stack disposed over a top surface of the isolation layer; and sidewall spacers disposed over a remaining portion of the top surface of the nanosheet stack surrounding the isolation layer and the gate stack.

19. The integrated circuit of claim 17, wherein the nanosheet field-effect transistor structure further comprises source/drain regions disposed over portions of the top surface of the substrate surrounding the sidewalls of the one or more vertical fins.

20. The integrated circuit of claim 19, wherein the curved thickness profile of the nanosheet extension regions gradually increases from the first thickness to the second thickness from the indented sidewalls of the gate stack layers to the source/drain regions.

* * * * *